United States Patent
Khoche et al.

(10) Patent No.: US 6,732,312 B2
(45) Date of Patent: May 4, 2004

(54) TEST VECTOR COMPRESSION METHOD

(75) Inventors: Ajay Khoche, Cupertino, CA (US); Jochen Rivoir, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 601 days.

(21) Appl. No.: 09/802,440

(22) Filed: Mar. 9, 2001

(65) Prior Publication Data

US 2002/0162066 A1 Oct. 31, 2002

(51) Int. Cl.[7] .......................... G01R 31/28; G06F 11/00
(52) U.S. Cl. ....................... 714/738; 714/728
(58) Field of Search ................. 714/724, 726, 714/728, 738, 739

(56) References Cited

U.S. PATENT DOCUMENTS

| | | | | |
|---|---|---|---|---|
| 5,243,603 A | * | 9/1993 | Broeren | 714/738 |
| 5,668,745 A | | 9/1997 | Day | 364/580 |
| 5,696,772 A | * | 12/1997 | Lesmeister | 714/32 |
| 5,991,898 A | * | 11/1999 | Rajski et al. | 714/30 |
| 6,223,316 B1 | * | 4/2001 | Bommu et al. | 714/738 |
| 6,327,687 B1 | * | 12/2001 | Rajski et al. | 714/738 |
| 6,421,794 B1 | * | 7/2002 | Chen et al. | 714/42 |
| 6,615,377 B1 | * | 9/2003 | da Cruz et al. | 714/724 |

OTHER PUBLICATIONS

"A Serial Scan Test Vector Compression Methodology" Su et al. This paper appears in: International Test Conference Proceedings Meeting Date: Oct. 17, 1993–Oct. 21, 1993 Publication Date: Oct. 17–21, 1993 On page(s): 981–988 INSPEC Accession No.: 4985355.*

Test Vector Decompression via Cyclical Scan Chains and its Application to Testing Core–based Designs Jas et al. Internationa Test Conference Proceedings, Oct. 18–23, 1998 Page(s): 458–464.*

Fast static compaction algorithms for sequential circuit test vectors □□Hsiao et al. IEEE Transactions on Computers, , vol. 48 Issue: 3 , Mar. 1999 □□Page(s): 311–322.*

* cited by examiner

*Primary Examiner*—Albert Decady
*Assistant Examiner*—Cynthia Britt

(57) ABSTRACT

A method of compressing a test vector creates a compressed test vector for use in conjunction with automated test equipment (ATE). The method comprises generating a test vector having a sequence of elements, at least one element of which comprises a 'don't care' value. A random sequence of elements is produced also. The test vector and the random sequence are segmented. Each segment of the test vector is compared to a corresponding segment of the random sequence to determine whether the corresponding segments match. When a match is found, a first flag value is sequentially inserted into a compression test vector. When a mismatch is found, a second flag value is sequentially inserted into the compression vector as well as the elements of the mismatched test vector segment. The compressed test vector may be decompressed according to the invention directly into a completely specified test vector using the flag values.

42 Claims, 5 Drawing Sheets

TEST VECTOR COMPRESSION METHOD

TECHNICAL FIELD

The invention relates to automatic test equipment for testing complex systems and integrated circuits. In particular, the invention relates to the generation and storage of test vectors used in automated test equipment.

BACKGROUND ART

Systems and the integrated circuits (ICs) or semiconductors that invariably make up the systems are continuing to evolve and become more and more complex. The complexity increases witnessed in the past and anticipated in the future have led to the extensive and widespread use of automated test equipment (ATE) for testing these systems and their constituent circuits. In fact, in some cases, system complexity has increased to such an extent that accurate and complete manual testing is either impractical or even impossible. In addition to making accurate and relatively complete testing practical in the case of complex systems, automated testing using is ATEs can and does significantly reduce the costs of producing a system and/or its constituent parts. A trend toward using ATEs for testing even simple systems and ICs has been evident for some time. Today it is fair to say that virtually all major systems and IC manufacturing lines use some form of ATE.

As illustrated as a block diagram in FIG. 1A, a typical ATE 10 comprises a central processing unit (CPU) 14, memory 12, input/output (I/O) 16 hardware, and usually some form of operator interface 18. The CPU 14 controls the operation of the ATE 10 employing a test vector stored in memory 12. The test vector, often produced by an external source 20, is transmitted to the ATE and loaded into memory 12 using the I/O hardware 16. During the automated test, the CPU 14 reads the test vector from memory and controls the I/O hardware 16 in order to affect a test of the device under test (DUT) 30. The operator interacts with the ATE through the operator interface 18. For simplicity, the system or IC being tested will be referred to hereinbelow as the DUT.

As noted hereinabove, a typical automated test by an ATE employs a test vector. A test vector is a sequence of test operations to be performed and/or test values to be applied by the ATE to the system or IC under test. In most modern ATEs, the test vector is a binary sequence owing to the overwhelming use of digital computers and memory in ATEs and the propensity for complex systems to be largely digital. Each test vector used by the ATE is normally generated by first consulting a design database or specification that identifies the functionality of the system or IC being tested. A test vector for a given DUT is generated by 'mapping' or translating the desired DUT functionality testing into the functionality testing capability of the ATE. The test vector is then typically transmitted to the ATE and stored in the ATE memory. The test vector subsequently controls the test of the DUT by the ATE.

FIG. 1B illustrates a flow chart of the steps in the conventional method of performing an automated test of a DUT using an ATE 10. The method of automated testing comprises the step of consulting 40 design specifications. The design specification defines the performance of the DUT and helps determine the tests that should be performed during automated testing. The method of automated testing further comprises the step of generating 42 a test vector. Typically the step of generating a test vector employs an apparatus or computer program called an automated test pattern generator (ATPG) that utilizes information from the design specification to generate test vectors that adequately test the DUT. In the conventional method of automated testing, the step of generating a test vector 42 is followed by a step of creating 44 a completely specified test vector. The test vector generated by the step of generating 42 typically has a number, often a large number, of so-called 'don't care' states. The step of creating 44 a completely specified test vector assigns explicit values to the 'don't care' states in the test vector. Often this assignment is accomplished by using a random sequence generated by a step of generating 43 a random sequence.

The step of creating 44 the completely specified test vector of the conventional method of automated testing is sometimes followed by an optional step of compressing 46 the completely specified test vector to reduce the size of the test vector. The method of automated testing further comprises the step of transmitting and storing 48 the completely specified and possibly compressed test vector in the memory 12 of the ATE 10. The ATE 10 utilizes the stored completely specified test vector in the step of testing 52 to complete the method of automated testing. If the completely specified test vector has been compressed, it must be decompressed in a step of decompressing 50 the completely specified test vector. The optional steps of compressing 46 and decompressing 50 are illustrated by dashed-line boxes in FIG. 1B.

As mentioned above, the test vector is a binary sequence. Much of following discussion assumes that the testing of digital devices with a binary test vector is without loss of generality. One skilled in the art could easily extend the concepts expressed hereinbelow to a digital test situation. The testing functionality of the ATE normally exceeds required functionality testing for a given DUT. In addition, not all possible combinations of inputs and outputs need to be tested in a typical DUT to verify that it is operational and/or to locate faults. The result is that the test vectors invariably contain a large number of unspecified or 'don't care' states in addition to specified states (i.e. those having explicitly specified values). In most situations, there are many more 'don't care' states in a given test vector than there are specified states.

As used herein, a specified state is an element of the test vector that is assigned a specific value as a result of mapping the DUT test functionality into ATE test functionality. A 'don't care' state is an element in the test vector that is not specified by the DUT to ATE functionality mapping and so, can take on any value constrained only by the limits placed on an element in the test vector. For example, in the case of a binary test vector, the specified state is either a '1' or a '0', as specified by the mapping. The 'don't care' state can be either a '1' or a '0' and is not specified by the mapping.

As discussed hereinabove, the test vector is usually constructed or generated using an apparatus or computer program known as an ATPG. For a digital case, the ATPG typically generates the test vector based on the DUT test specification using three-level logic consisting of {1, 0, X} where the X is a 'don't care' value indicating a 'don't care' state. Thus, the test vector is initially filled with a sequence of '1's, '0's and 'X's. The method defining how the ATPG decides to construct a test vector is beyond the scope of this discussion. In general, however, the ATPG generally attempts to construct a test vector that maximizes the probability of finding all potential faults while simultaneously minimizing the test time for a given DUT.

The test vector, when transmitted to and stored in the ATE memory, must have an unambiguous value. Therefore, the ATPG must assign a deterministic value to all 'don't care' states. Typically the assignment of a value to a 'don't care' state by the ATPG is accomplished using a random sequence generator. The random sequence generator "fills" the 'don't care' states of the test vector with random values. For example, in the case of a binary test vector, the specified states are assigned the appropriate value, either '1' or '0' and then a random sequence generator that generates a random binary string is consulted to fill the 'don't care' states.

FIG. 2 illustrates an example of a typical test vector, as generated by the produce a conventional, completely specified test vector. In the first line 81 of FIG. 2, a sequence generated by the ATPG, including 'don't care' states, is depicted. In the next line 82, a random binary sequence, as might be generated by the random sequence generator, is shown. Finally, in the last line 83 of FIG. 2, the completely specified test vector, as it exists after replacing the 'don't care' states with corresponding bits from the random sequence, is illustrated. It is the last sequence of the last line 83 of FIG. 2 that is conventionally transmitted to and stored in the memory of the ATE. The filled test vector is referred to herein as a "completely specified" test vector to distinguish it from the test vector including 'don't care' states.

Conventionally, the completely specified test vector is transmitted to and stored in the memory of the ATE. Test vectors can be very large and can occupy significant amounts of memory in the ATE. In many cases, memory necessary to store the test vectors in the ATE may account for as much as 50% of the cost of the ATE. Moreover, even when ATE memory cost is not a significant factor, the time associated with transmitting the test vector to the ATE memory can be significant. Additionally, a device may require more memory for storing test vectors than is available in a given ATE. Therefore, it is advantageous to consider approaches to compressing the test vector to minimize the amount of memory needed for a given test vector.

Conventional test vector compression approaches include (i) using some form of encoding on the test vector and (ii) breaking the test vector into a pair of vectors, one for data bits and another for containing a control program. The first of these two approaches borrows from conventional compression technology used in such technology areas as disk drives and digital communications. A compression algorithm is applied to the completely specified test vector. The compression algorithm reduces the size of the completely specified test vector by removing redundancy typically using an encoding technique. The compressed test vector is then transmitted to and stored in the ATE memory. During execution of the test by the ATE, the compressed test vector is decompressed using a reverse of the compression algorithm used for compression. Compression of binary test vectors of as much as 50% is often achieved by this approach. One skilled in the art would readily identify a number of applicable compression algorithms for compressing completely specified test vectors.

The second approach to test vector compression employs an algorithm to segregate the completely specified test vector generated by the ATPG into two or more, smaller vectors that when taken together are smaller than the original completely specified test vector. These two smaller vectors are generally distinguished in that one contains so called "data" while the other contains "instructions". The instruction vector used in conjunction with the data vector enables the reconstruction of a completely specified test vector equivalent to that originally generated by the ATPG. Of course, to use this approach for compressing a completely specified test vector, the ATE must be capable of "executing the instructions". Enabling the ATE to execute the instructions is not fundamentally different from executing a decompression algorithm required by the first approach to compression. G. Lesmeister, U.S. Pat. No. 5,696,772, discloses an example of this form of compression.

Typically, ATEs provide an ability to execute fairly general software programs within the central processing unit (CPU) of the ATE. Therefore, the requirements for decompression placed on the ATE by the above described compression approaches do not pose a significant limitation. It should be noted that in both cases of test vector compression described hereinabove, the ATPG generated test vectors processed by the compression algorithms are completely specified test vectors.

Accordingly, it would be advantageous to have a method for generating and storing a test vector for use in an ATE that significantly reduces the amount of memory required to store the pattern. In addition, it would be desirable that such a method takes advantage of the 'don't care' states typically found in the test vector prior to complete specification to facilitate compression of the test vector. Such a method would significantly improve the average efficiency of compression thereby solving a long-standing need for test vector memory reduction in the area of ATE testing.

SUMMARY OF THE INVENTION

The present invention provides a novel test vector compression method. The test vector compression method creates a compressed test vector for use in conjunction with automated test equipment (ATE).

In one aspect of the present invention, a method of compressing a test vector is provided. The method of compressing comprises the steps of generating the test vector having a sequence of elements, and producing a random sequence of elements having at least the same number of elements as the test vector. At least one element of the test vector comprises a 'don't care' value indicating a 'don't care' state. The method of compression further comprises the steps of sequentially segmenting the test vector into segments of the test vector elements and similarly segmenting the random sequence into corresponding segments of the random sequence elements. Each segment of the test vector is compared to a corresponding segment of the random sequence to determine whether the corresponding segments match or do not match. When a match is found, a first flag value is sequentially inserted into a first sequence. When a mismatch is found, a second flag value is sequentially inserted into the first sequence as well as the elements of the mismatched test vector segment. The compressed test vector is created from the first sequence when all of the segments have been compared.

The compressed test vector produced by the method of the present invention can be transmitted to and stored in the ATE memory. Further, the method of compressing according to the invention eliminates the step of specifying the 'don't care' states prior to the compression step. Advantageously, the storage requirements of the compressed test vector produced by the method of the present invention are much smaller than those of a completely specified test vector conventionally used in ATE.

In one embodiment, the method of compressing a test vector further comprises the step of decompressing the compressed test vector to produce a decompressed test vector that is the same as the completely specified test vector conventionally used by ATE. The ATE can be adapted for decompression in accordance with the method of the invention. Decompression comprises the steps of examining the compressed test vector sequentially for the first flag value and the second flag value. When a first flag value is found, the elements of the corresponding random sequence are inserted into a second sequence. When a second flag value is found, the elements of the compressed test vector that follow the second flag value are inserted into the second sequence. The decompressed test vector is produced from the second sequence after the entire compressed test vector has been examined. The decompressed test vector is a completely specified test vector, such as that conventionally used in ATE.

In another aspect of the present invention, a method of compressing and decompressing a test vector that has a sequence of elements is provided. The method comprises the step of producing a random sequence of elements having at least a same number of elements as the test vector. The method further comprises the steps of sequentially segmenting the test vector into segments of the test vector elements, wherein at least one element of the test vector comprises a 'don't care' value, and similarly segmenting the random sequence into corresponding segments of the random sequence elements. The method further comprises the step of comparing each segment of the test vector to corresponding segments of the random sequence to determine whether the corresponding segments match. The test vector is compressed by inserting one flag value for the matched corresponding segments and another different flag value for the corresponding segments that do not match (mismatched). The compressed test vector is then decompressed into a completely specified test vector based on the different flag values.

In one embodiment of the method of compressing and decompressing a test vector, the step of compressing comprises the step of sequentially inserting a first flag value into a first sequence for each segment of the test vector that matches a corresponding segment of the random sequence. Compression further comprises the steps of sequentially inserting a second flag value into the first sequence for each segment of the test vector that does not match a corresponding segment of the random sequence followed by inserting the elements of the mismatched test vector segment into the first sequence. The compressed test vector is created from the first sequence when all of the segments have been considered.

In another embodiment of the method of compressing and decompressing a test vector, the step of decompressing comprises the steps of generating another random sequence of elements that is the same as the random sequence produced in the step of producing; sequentially inserting the corresponding elements of the other random sequence into a second sequence for each flag value indicating a match; and sequentially inserting the elements of the compressed test vector that follow each flag value indicating a mismatch into the second sequence. The decompressed test vector is created from the second sequence when the entire compressed test vector has been considered. The decompressed test vector is a completely specified test vector.

According to the invention, corresponding segments match when each element of the test vector segment matches the corresponding element of the corresponding random sequence segment. Further, an element of the test vector segment matches a corresponding element of the random sequence segment when the respective element has the same value or when the element of the test vector segment has the 'don't care' value. The compressed test vector is transmitted to and stored in the memory of the ATE. Advantageously, in part because of the number of 'don't care' states typically found in ATPG generated test vectors, the compressed test vector requires considerably less storage space in memory as compared to a completely specified test vector that would have been generated from the test vector using conventional methods. Conventional ATEs can perform the step of decompression, provided that the ATE is modified to support the decompression steps of the invention.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a novel method of compressing and decompressing a test vector used in conjunction with automated test equipment (ATE). The method of the present invention produces a compressed test vector from a test vector generated by an automatic test pattern generator (ATPG). The compressed test vector produced by the method of the present invention can be transmitted to and stored in the ATE memory. Advantageously, the storage requirements of the compressed test vector are much smaller than those of the completely specified test vectors conventionally used in ATEs. Moreover, according to the present invention, the ATE can decompress the compressed test vector during ATE operation to produce the completely specified test vector for use in an automated test.

Figure 1A:
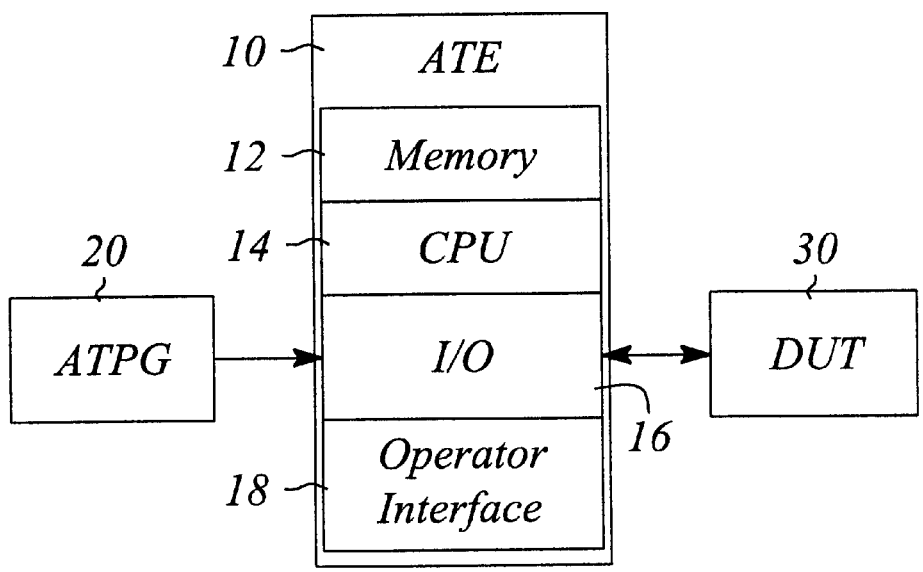
FIG. 1A illustrates a block diagram of a typical ATE system including an ATPG for generating a test vector.
Figures 1B, 2:
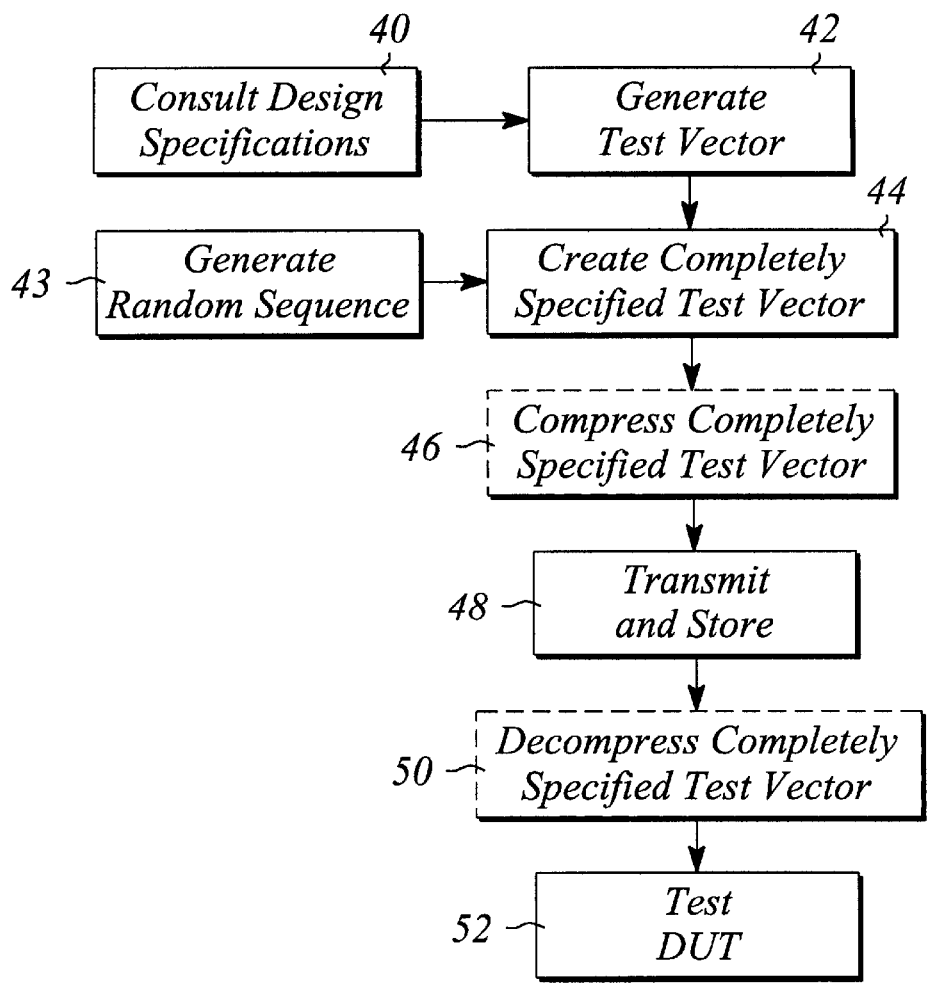
FIG. 1B illustrates a flow chart of the major steps of generating and using a test vector in the ATE of FIG. 1A.
FIG. 2 illustrates an example of a test vector, a random sequence and a corresponding completely specified test vector.
Figure 3:
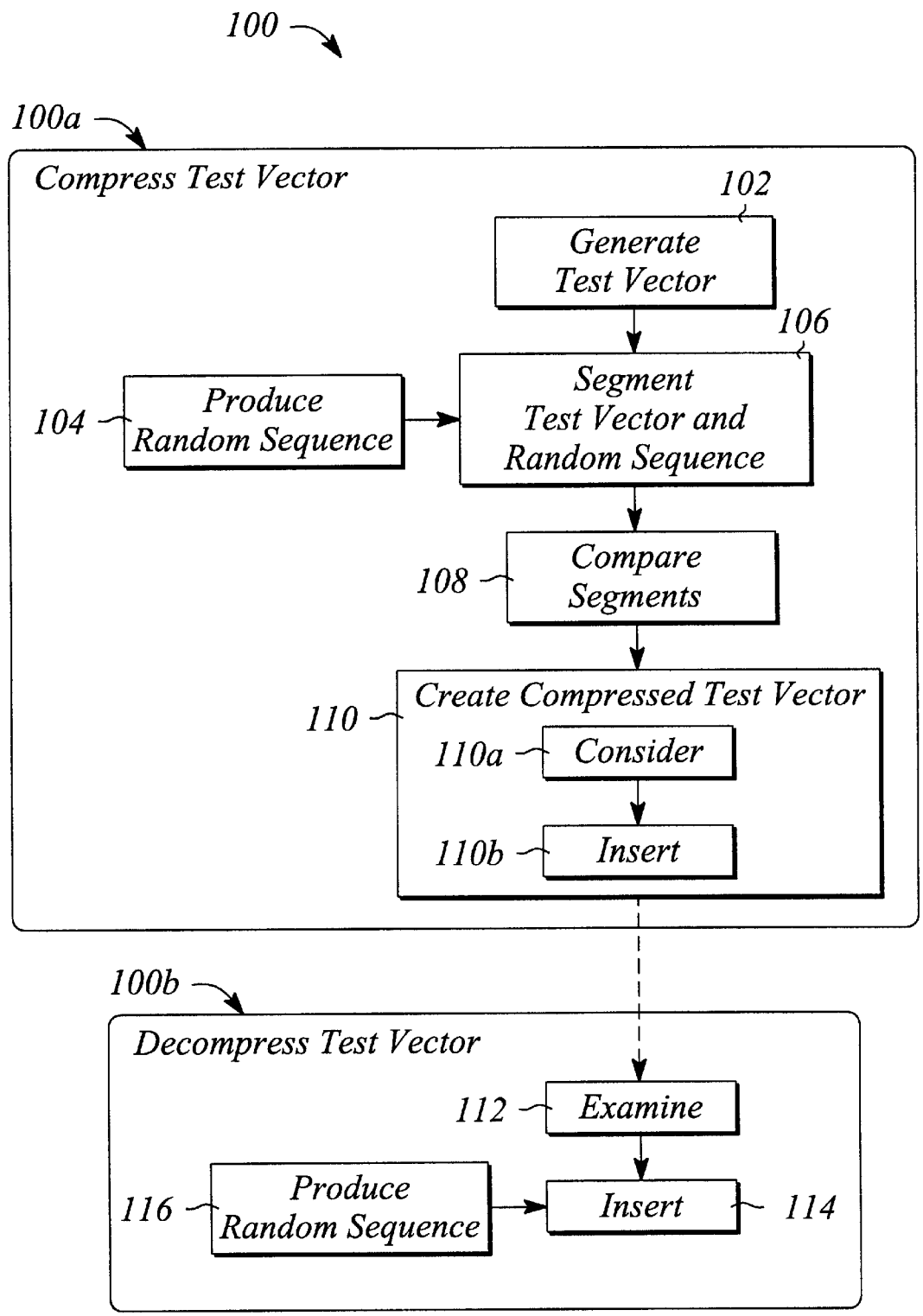
FIG. 3 illustrates a flow chart of a method of compressing a test vector for use with an automatic test equipment (ATE) according to the present invention.

FIG. 3 illustrates a flow chart of a method 100 of compressing and decompressing a test vector for use with an automatic test equipment (ATE) according to the present invention. The method 100 of compressing and decompressing of the present invention comprises a method 100a of compressing and a method 100b of decompressing. The method 100a of compressing produces a compressed test vector, while the method 100b decompresses the compressed test vector and produces a completely specified test vector.

The method 100a of compressing comprises the step of generating 102 a test vector, preferably with an automatic test pattern generator (ATPG), or with other suitable means, such that the test vector includes specified states and 'don't care' states. The step of generating 102 can use any conventional method of producing a test vector for the ATE. Accordingly, the step of generating 102 a binary test vector, for example, could result in a test vector consisting of elements of the set {0, 1, X} wherein 'X' indicates a 'don't care' state or value. Such a test vector is illustrated by way of example in the first line 121 of Column 1 of FIG. 4. All conventional methods for producing a test vector that includes 'don't care' states are within the scope of the present invention. Further, the method 100 of the present invention can be applied to at least one test vector, and preferably all test vectors, for a DUT.

Figure 4:
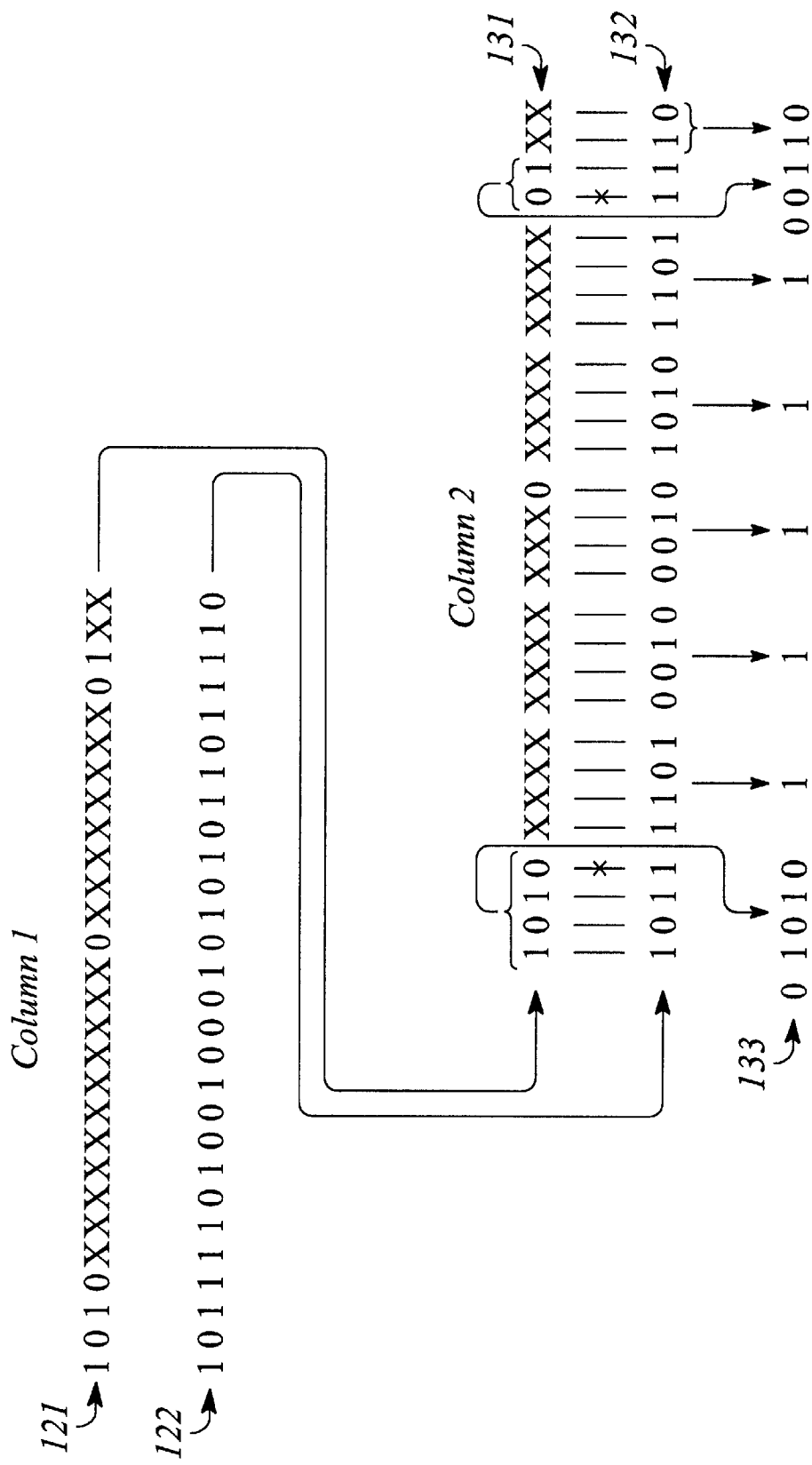
FIG. 4 illustrates an example of using the method of compressing a test vector of the present invention to produce a compressed test vector.

As illustrated in FIG. 3, the method 100a further comprises the step of producing 104 a random sequence using a random sequence generator. Referring to FIG. 4, the second line 122 of Column 1 represents an example of a random sequence as may result from the step of producing 104 the random sequence. The random sequence can be generated with any one of several well-known algorithms for generating random sequences. The only requirement is that the random sequence thus produced be repeatable. This is a common property of random sequence generators used in digital computers, wherein a given "seed" or initial value produces a particular random sequence. The same seed value always produces the same random, or more correctly, pseudo-random sequence. One skilled in the art would readily identify suitable random sequence generators without undue experimentation. All such random sequence generators or algorithms are within the scope of the present invention.

Referring back to FIG. 3, the method 100a further comprises segmenting 106 the test vector and random sequence into test vector segments and random sequence segments. The segments can have either a fixed length or a variable length. For example, if a segment length of four is used, the step of segmenting 106 comprises sequentially selecting 106a sets of four elements from each of the test vector and the random sequence, respectively, and assigning these elements to subsequent test vector segments and random sequence segments. Referring again to the example illustrated in FIG. 4, the results of the step of segmenting 106 are illustrated in the first and second lines 131, 132 of Column 2. For the example illustrated in FIG. 4, the segment size is fixed and equal to four. The segment size of four and fixed condition are illustrative only and not intended to limit the scope of the present invention. The first line 131 of Column 2 corresponds to the segmented test vector while the second line 132 of Column 2 corresponds to the segmented random sequence.

The method 100a further comprises the step of comparing 108 the segments of the segmented test vector to the corresponding segments of the segmented random sequence, as is further illustrated in FIG. 3. In the step of comparing 108, the elements in each segment of the segmented test vector are compared to the corresponding elements in the corresponding segment of the segmented random sequence. If all of the elements of a given test vector segment match the corresponding elements of a corresponding random sequence segment, the segments are said to match. For each segment, the comparison will either result in either a "match" or a "mismatch".

A pair of elements from the test vector segment and the random sequence segment matches if the elements of the pair "agree" with each other. For example, a '0' at a given position in a test vector segment agrees with a '0' in a corresponding location in a random sequence segment. Table 1 expands on this concept and defines whether agreement exists for all possible states of elements of a test vector segment and a random sequence segment. The column labeled "Test Vector Bit" corresponds to elements from a test vector segment while the column labeled "Random Sequence Bit" corresponds to elements from a random sequence segment. The example illustrated in Table 1 assumes three-level logic consisting of elements taken from the set {0, 1, X} wherein 'X' represents a 'don't care' state. Thus a '1' in the test vector segment matches a '1' in the random sequence segment, a '0' matches a '0' and an 'X' matches either a '1' or a '0'.

TABLE 1

Definition of element matching for the step of comparing 108.

| Test Vector Bit | Random Sequence Bit | Decision |
| --- | --- | --- |
| X | 0 | agree |
| X | 1 | agree |
| 0 | 0 | agree |
| 1 | 1 | agree |
| 0 | 1 | not agree |
| 1 | 0 | not agree |

Referring back to FIG. 3, the method 100a further comprises step of creating 110 a compressed test vector by sequentially inserting a '1' in a first or compressed sequence for each segment that matches and/or inserting a '0' followed by the elements of the test vector segment in the compressed sequence for each segment that does not match. When completed, the compressed sequence is the compressed test vector. The step of creating 110 a compressed test vector comprises the step considering 110a a pair of segments and then the step of inserting 110b either a '1', or a '0' followed by the element of the segment being considered, depending on whether the segment pair matched or not in the step of comparing 108, as described in more detail below.

In essence, the step of creating 110 begins by considering 110a a first pair of segments. If the first segment pair is matched or agrees as determined in the step of comparing 108, '1' is inserted 110b as a first element of the first or compressed sequence. If the first segment pair does not match, a '0' is inserted 110b as the first element of the compressed sequence, and the next S elements inserted 110b in the compressed sequence are elements copied from the first segment of the test vector, where S is the segment size (i.e., the number of elements in a segment). A next pair of segments is then considered 110a and a '1' is inserted 110b as a next element of the compressed sequence if the next segment pair is matched. Or, as before, if the next segment pair does not match, the next elements in the compressed sequence are a '0' followed by the elements of the test vector segment. If a pair of segments does not match and the test vector segment includes one or more 'don't care' elements, the corresponding elements of the random vector segment are copied into the compressed sequence. The step of creating 110 comprising the steps of considering 110a and inserting 110b repeats sequentially for each successive pair of segments until all segments of the test vector are processed.

Referring again to the example illustrated in FIG. 4, the third line 133 of Column 2 corresponds to the compressed test vector that results from the first sequence after the steps of comparing 108 and creating 110 of the method 100, 100a of the present invention. As can be seen in the example illustrated in FIG. 4, the first segment pair does not match as denoted by the "x" through the vertical line below the last element of the segment. Therefore the first element of the compressed test vector is '0'. The next four (S=4) elements of the compressed test vector are copied from the test vector into the compressed test vector since all of these elements were specified in the first segment. The next segment pair of the example matches since this test vector segment consists only of 'don't care' or 'X' elements. Therefore the next element (element 6 counting from the left in line 133) of the compressed test vector in line 133 is '1'. Similarly, the third, fourth, fifth and sixth pairs all match, so a '1' is inserted 110*b* in the compressed test vector of line 133 for each of these segment pairs (elements 7–10 of line 133). The seventh pair does not match, as denoted by the "x" through the vertical line below the first element of the last segment. Moreover, in the seventh segment of the test vector, the last two of the elements are "Xs", indicating 'don't care' states. A '0' is inserted as a "flag value" in the compressed test vector, indicating a mismatch between these two segments, as described above for the first segment mismatch. Then, the specified elements, those having a value of either '1' or '0' of the test vector are then copied and inserted into the corresponding element positions of the compressed test vector. Further, the values for the elements having a 'don't care' state in the test vector are copied from the corresponding locations in the random vector segment and inserted into the compressed test vector in line 133.

The compressed test vector produced by the method 100*a* of the present invention consists of a series of "flags" or indicator values, one flag indicating a match between segment pairs and the other indicating a mismatch. The flag indicating a mismatch is followed in the compressed test vector by the specified elements of the original test vector segment associated with that flag along with elements from the random sequence for the 'don't care' states. As described hereinabove, three-level logic with values taken from the set {0, 1, X} was used for illustrative purposes. One skilled in the art could readily extend the described method 100*a* to m-level logic or an m-ary alphabet, where m>3. In addition, one skilled in the art would readily recognize that other values for the flag, other than '1' for indicating match and/or '0' for indicating mismatch, could be substituted without changing the essential nature of the compression produced by the method 100*a*. All such m-ary alphabets and alternative flag values are within the scope of the present invention.

The compressed test vector is transmitted to and stored in the memory of the ATE. Advantageously, in part because of the number of 'don't care' states typically found in ATPG generated test vectors, the compressed test vector requires considerably less storage space in memory as compared to a completely specified test vector that would have been generated from the test vector using conventional methods. The number of bits required for the storage of a binary compressed test vector produced by method 100*a* of the present invention is given by equation (1).

$$\sum_{i=0}^{S} (N_i \times p^i + (1 - p^i) \times N_i \times (S + 1)) \quad (1)$$

where S is the segment size, $N_j$ is the number of segments in the test vector which have j specified bits (i.e. having either a '1' or a '0' value), p is the probability that a specified bit in a segment matches with a corresponding bit in the corresponding random segment, and where $$\sum_{j=0}^{S} N_j = N \quad (2)$$

Furthermore, the segment size S used in conjunction with method 100*a* of the present invention can be varied to optimize the effectiveness of the compression process.

During the automated test performed by the ATE, the compressed test vector is decompressed to produce a completely specified test vector. To facilitate decompressing the compressed test vector, a random sequence generator, which generates a random sequence identical to the random sequence produced in step 104 of the method 100*a* of compressing, is required. The random sequence generator used in the decompression can be the same one used during the step of producing 104 a random sequence. Preferably, another random sequence generator that produces the identical random sequence is employed during decompression. Recall that a flag value of '1' in the compressed test vector for the three-level logic case, described hereinabove, indicates a match. During decompression of the compressed test vector, a flag value of '1' indicates 'use the corresponding values from the random sequence'. Similarly, a flag value of '0' indicates 'use the following S values of the compressed test vector for the completely specified test vector'. Therefore, the same random sequence is necessary during compression and decompression according to the invention.

The method 100*b* of decompressing of the present invention operates on the compressed test vector to produce a decompressed test vector, the decompressed test vector corresponding to the completely specified test vector used by the ATE. The method 100*b* of decompressing comprises the step of examining 112 a flag value of the compressed test vector and the step of inserting 114 values into the decompressed test vector, as described in more detail below.

The method 100*b* of decompressing begins with examining 112 a first element in the compressed test vector. The first element of a compressed test vector is, by definition, a first flag value. If the first flag value indicates a mismatch, for example a '0' in the three-level logic case described hereinabove, the next S elements of the compressed test vector are copied and inserted 114 into the first S positions in a second or decompressed sequence. A next flag value is the next element in the compressed test vector immediately following the S elements that are copied. When a flag value indicating a mismatch is found, the next S elements of the random sequence are discarded.

If the first flag value indicates a match, for example a '1' in the three-level logic case described hereinabove, the first S elements of the random sequence produced in the step of producing 116 by the random sequence generator are inserted 114 into the decompressed sequence. The next flag value is the next element in the compressed test vector when a flag value indicating that match is found. According to the method 100*b* of the invention, the steps of examining 112 and inserting 114 are repeated for each element corresponding to a flag value in the compressed test vector.

Figure 5:
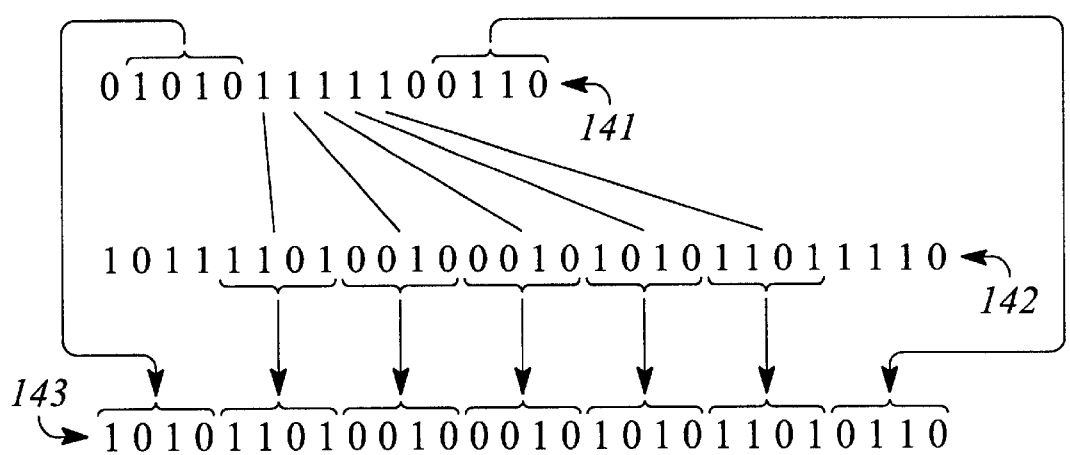
FIG. 5 illustrates an example of decompressing the compressed test vector in the example of FIG. 4 in accordance with the method of the present invention.

To clarify this description of the method 100*b* of decompressing, refer again to the example of FIG. 4. In the example illustrated in FIG. 4, recall that the compressed test vector was binary and the flag values were either '1' indicating a match and '0' indicating a mismatch and the segment size S was four. FIG. 5 illustrates an example of decompressing the compressed test vector created in the example of illustrated in FIG. 4.

Referring to FIG. 5, the first line 141 corresponds to the compressed test vector of line 133 in FIG. 4. The second line 142 corresponds to the random sequence from the step of producing 116. Note that the random sequence is the same random sequence in lines 122 and 132 of FIG. 4 that was generated 104 during the method 100a of compression.

Since the first element of the compressed test vector is '0', indicating a mismatch, the next four elements of the compressed test vector are copied or inserted 114 into the decompressed sequence as the first four elements, as illustrated in the third line 143 of FIG. 5. The first four elements of the random sequence illustrated in line 142 of FIG. 5 are discarded. The next flag value in the compressed test vector of line 141 is located at position 6 (counting from the left in line 141) and is a '1' indicating a match during compression. As a result, the next four elements of the random sequence in line 142, the $5^{th}$, $6^{th}$, $7^{th}$, and $8^{th}$ elements, are copied into the $5^{th}$, $6^{th}$, $7^{th}$, and $8^{th}$ element positions in the decompressed sequence in line 143. This process repeats on each of the flag values until a complete, decompressed test vector is produced from the second or decompressed sequence. A quick comparison between the decompressed test vector in line 143 of FIG. 5 and the test vector in line 121 of FIG. 4 reveals that the decompressed test vector is the test vector with the 'don't care' states ('X') replaced by corresponding values from the random sequence.

Advantageously, the method 100b of decompressing the compressed test vector produces a decompressed test vector that is identical to the completely specified test vector that would have been produced, transmitted and stored in the ATE memory using conventional methods. Therefore, the ATE can use the decompressed test vector of the present invention in the same way as the conventional completely specified test vector, but advantageously requires less memory to store the compressed test vector. The only modification to the conventional ATE that is necessary for the method 100 compressing and decompressing the test vector according to the invention is to provide the ability to generate 104, 116 the same or identical random sequence and the ability to perform the decompression steps of the method 100b.

The method 100b of decompression can be implemented in hardware or software according to the invention. In a hardware implementation, the method 100b of decompression can be implemented as a microelectronic circuit on a chip. In a software implementation, the central processing unit CPU of the ATE can be adapted to include software to execute the decompression steps. As in the case of other conventional compression methodologies, the requirement for decompression 100b processing according to the invention in the ATE does not significantly limit the applicability of the present invention.

Moreover, the method 100 of compressing and decompressing a test vector of the present invention advantageously can be used in conjunction with conventional compression methodologies to achieve even greater compression. For example, a conventional compression algorithm can be applied to the compressed test vector produced by method 100a of the present invention. In the ATE, prior to commencing the method 100b of decompressing, the reverse of the conventional compression algorithm is applied to produce the original compressed test vector. Given that there are likely to be long sequences of "1s" in the compressed test vector produced by method 100a, even something as simple as a run-length encoding algorithm should yield additional compression above and beyond that afforded by the method 100.

Thus, there has been described a novel method 100 of compressing (100a) and decompressing (100b) a test vector having application to ATE. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of compressing a test vector comprising the steps of:

generating the test vector, the test vector having a sequence of elements, at least one element comprising a 'don't care' value indicating a 'don't care' state;

producing a random sequence of elements having a same number of elements as the test vector;

sequentially segmenting the test vector into segments of the test vector elements;

similarly segmenting the random sequence into segments of the random sequence elements corresponding to the test vector segments;

comparing each segment of the test vector to a corresponding segment of the random sequence; and creating a compressed test vector from the comparison.

2. The method of compressing of claim 1, wherein the step of creating a compressed test vector comprises the steps of:

(a) considering whether the corresponding segments match or mismatch;

(b) sequentially inserting a first flag value for a match in a first sequence; and (c) sequentially inserting a second flag value for a mismatch in the first sequence and inserting the elements of the mismatched test vector segment into the first sequence after the second flag value.

3. The method of compressing of claim 2, further comprising the step of repeating the step (a) of considering and the steps (b) and (c) of sequentially inserting until all of the segments of the test vector are considered, thereby creating the compressed test vector from the first sequence.

4. The method of compressing of claim 2, wherein in the step (a) of considering, corresponding segments match when each element of the test vector segment matches a corresponding element of the corresponding random sequence segment.

5. The method of compressing of claim 4, wherein during the step (a) of considering, an element of the test vector segment matches a corresponding element of the random sequence segment when the respective element has the same value or when the element of the test vector segment has the don't care value.

6. The method of compressing of claim 2, further comprising the step of decompressing the compressed test vector to produce a decompressed test vector.

7. The method of compressing of claim 6, wherein the step of decompressing comprises the steps of:

(d) examining the compressed test vector sequentially for the first flag value and the second flag value;

(e) sequentially inserting corresponding elements of the random sequence into a second sequence when the first flag value is found; and (f) sequentially inserting the elements of the compressed test vector that follow the second flag value into the second sequence when the second flag value is found.

8. The method of compressing of claim 7, wherein the step of decompressing further comprises the step of repeating the step (d) of examining and the steps (e) and (f) of sequentially inserting until all elements of the compressed test vector are examined, thereby producing a decompressed test vector from the second sequence.

9. The method of compressing of claim 8, wherein the decompressed test vector is a completely specified test vector.

10. The method of compressing of claim 7, wherein before the step (e) of sequentially inserting corresponding elements, the step of decompressing further comprises the steps of:
   generating another random sequence of elements that is the same as the random sequence produced in the step of producing; and
   using the corresponding elements from the other random sequence in the step (e) of sequentially inserting.

11. The method of compressing according to claim 6 being applied to all test vectors of a device under test using automatic test equipment.

12. The method of compressing of claim 6, wherein the step of decompressing is implemented as hardware in automatic test equipment.

13. The method of compressing of claim 12, wherein the hardware is a microelectronic chip.

14. The method of compressing of claim 6, wherein the step of decompressing is implemented as software in automatic test equipment.

15. The method of compressing of claim 14, wherein the software is incorporated into a central processing unit of the automatic test equipment.

16. The method of compressing of claim 1, wherein in the steps of sequentially segmenting and similarly segmenting, the number of elements in each corresponding pair of test vector and random sequence segments is the same.

17. The method of compressing of claim 1, wherein in the steps of sequentially segmenting and similarly segmenting, the number of elements in at least one corresponding pair of test vector and random sequence segments differs from the number of elements in another pair of corresponding segments.

18. The method of compressing according to claim 1 being applied to all test vectors of a device under test using automatic test equipment.

19. A method of compressing and decompressing a test vector having a sequence of elements comprising the steps of:
   producing a random sequence of elements having at least a same number of elements as the test vector;
   sequentially segmenting the test vector into segments of the test vector elements, at least one element of the test vector having a don't care value;
   similarly segmenting the random sequence into segments of the random sequence elements corresponding to the test vector segments;
   sequentially comparing each segment of the test vector to the corresponding segment of the random sequence to determine whether corresponding pairs of test vector and random sequence segments match;
   compressing the test vector by inserting different flag values for matched pairs of corresponding segments and for corresponding pairs of segments that do not match; and
   decompressing the compressed test vector into a completely specified test vector based on the different flag values.

20. The method of compressing and decompressing a test vector of claim 19, wherein in the step of compressing, corresponding segments match when each element of the test vector segment matches a corresponding element of the corresponding random sequence segment of the pair.

21. The method of compressing and decompressing a test vector of claim 19, wherein during the step of compressing, an element of the test vector segment matches a corresponding element of the random sequence segment in a pair when the respective element has the same value or when the element of the test vector segment has the don't care value.

22. The method of compressing and decompressing a test vector of claim 19, wherein the step of compressing comprises the steps of:
   sequentially inserting a first flag value into a first sequence for each segment of the test vector that matches the corresponding segment of the random sequence; and
   sequentially inserting a second flag value into the first sequence for each segment of the test vector that does not match the corresponding segment of the random sequence followed by inserting the elements of the mismatched test vector segment into the first sequence to create a compressed test vector from the first sequence.

23. The method of compressing and decompressing a test vector of claim 19, wherein the step of decompressing comprises the steps of:
   generating another random sequence of elements that is the same as the random sequence produced in the step of producing;
   sequentially inserting corresponding elements of the other random sequence into a second sequence for each flag value indicating a match; and
   sequentially inserting the elements of the compressed test vector that follow each flag value indicating a mismatch into the second sequence to produce the completely specified test vector from the second sequence.

24. The method of compressing and decompressing a test vector of claim 19, wherein in the steps of sequentially segmenting and similarly segmenting, the number of elements in each corresponding pair of test vector and random sequence segments is the same.

25. The method of compressing and decompressing a test vector of claim 13, wherein in the steps of sequentially segmenting and similarly segmenting, the number of elements in at least one corresponding pair of test vector and random sequence segments differs from the number of elements in another corresponding pair of segments.

26. The method of compressing and decompressing according to claim 19 being applied to all test vectors of a device under test using automatic test equipment.

27. The method of compressing and decompressing of claim 19, wherein the step of decompressing is implemented as hardware in automatic test equipment.

28. The method of compressing and decompressing of claim 27, wherein the hardware is a microelectronic chip.

29. The method of compressing of claim 19, wherein the step of decompressing is implemented as software in automatic test equipment.

30. The method of compressing of claim 29, wherein the software is incorporated into a central processing unit of the automatic test equipment.

31. A method of compressing and decompressing a test vector having a sequence of elements comprising the steps of:
   producing a random sequence of elements having at least a same number of elements as the test vector;

sequentially segmenting the test vector into segments of the test vector elements, the test vector comprising elements having don't care values;

similarly segmenting the random sequence into segments of the random sequence elements corresponding to the test vector segments;

comparing each segment of the test vector to the corresponding segment of the random sequence to determine whether the corresponding segments match;

sequentially inserting a first flag value into a first sequence for each segment of the test vector that matches the corresponding segment of the random sequence;

sequentially inserting a second flag value into the first sequence for each segment of the test vector that does not match the corresponding segment of the random sequence followed by inserting the elements of the mismatched test vector segment into the first sequence to create a compressed test vector from the first sequence;

examining the compressed test vector for first flag values and second flag values;

sequentially inserting the elements of the random sequence corresponding to each of the first flag values into a second sequence; and sequentially inserting the elements of the compressed test vector that follow each of the second flag values into the second sequence to produce the decompressed test vector from the second sequence.

32. The method of compressing and decompressing of claim 31, wherein in the step of comparing, corresponding segments match when each element of the test vector segment matches a corresponding element of the corresponding random sequence segment.

33. The method of compressing and decompressing of claim 31, wherein during the step of comparing, an element of the test vector segment matches a corresponding element of the random sequence segment when the respective element has the same value or when the element of the test vector segment has the don't care value.

34. The method of compressing and decompressing of claim 31, wherein in the steps of sequentially segmenting and similarly segmenting, the number of elements in each of the corresponding test vector and random sequence segments is the same.

35. The method of compressing and decompressing of claim 31, wherein in the steps of sequentially segmenting and similarly segmenting, the number of elements in at least one pair of corresponding test vector and random sequence segments differs from the number of elements in another pair of corresponding segments.

36. The method of compressing and decompressing of claim 31, wherein the decompressed test vector is a completely specified test vector.

37. The method of compressing and decompressing of claim 31, wherein before the steps of sequentially inserting the elements, the method further comprises the steps of:

generating another random sequence of elements that is the same as the random sequence produced in the step of producing; and using corresponding elements from the other random sequence in the step of sequentially inserting the elements of the random sequence.

38. The method of compressing and decompressing according to claim 31 being applied to all test vectors of a device under test using automatic test equipment.

39. The method of compressing and decompressing of claim 31, wherein the step of examining and the steps of sequentially inserting the elements are implemented as hardware in automatic test equipment.

40. The method of compressing and decompressing of claim 39, wherein the hardware is a microelectronic chip.

41. The method of compressing and decompressing of claim 31, wherein the steps of examining and sequentially inserting the elements are implemented as software in automatic test equipment.

42. The method of compressing and decompressing of claim 41, wherein the software is incorporated into a central processing unit of the automatic test equipment.

* * * * *